(12) United States Patent
Jones

(10) Patent No.: US 7,049,526 B2
(45) Date of Patent: May 23, 2006

(54) MICROVIA STRUCTURE AND FABRICATION

(75) Inventor: Christopher C. Jones, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 316 days.

(21) Appl. No.: 10/700,209

(22) Filed: Nov. 3, 2003

(65) Prior Publication Data

US 2005/0092521 A1    May 5, 2005

(51) Int. Cl.
*H05K 1/00*    (2006.01)
(52) U.S. Cl. ...................................... 174/253
(58) Field of Classification Search ............... 174/253, 174/260, 261, 2; 361/792–795
See application file for complete search history.

(56) References Cited

U.S. PATENT DOCUMENTS

| 6,093,630 | A | * | 7/2000 | Geffken et al. ............. 438/612 |
| 6,093,643 | A | * | 7/2000 | Akram ....................... 438/652 |
| 6,294,745 | B1 | * | 9/2001 | Gruber ....................... 174/263 |
| 2005/0016768 | A1 | * | 1/2005 | Zollo et al. ................ 174/262 |

* cited by examiner

*Primary Examiner*—Randy W. Gibson
*Assistant Examiner*—Yuriy Semenenko
(74) *Attorney, Agent, or Firm*—Buckley, Maschoff & Talwalkar LLC

(57) ABSTRACT

A system may include a first microvia pad, a second microvia pad having a projection extending in a direction toward the first microvia pad, and a microvia electrically coupled to the first microvia pad and to the second microvia pad.

13 Claims, 21 Drawing Sheets

MICROVIA STRUCTURE AND FABRICATION

BACKGROUND

An integrated circuit (IC) die may include electrical devices that are integrated within a semiconductor substrate. An IC package is often used to electrically couple the electrical devices of an IC die to external components/circuitry. An IC package may also protect an IC die and provide a suitable operating environment thereto.

An IC package may include layers of conductive paths, or traces, that carry signals between an IC die and the external components/circuitry. Microvias within an IC package may electrically couple traces that are disposed in different layers of the IC package. A microvia may be drilled into the IC package using a laser and/or may be fabricated using conventional photolithography. Various factors may cause a microvia to delaminate from surrounding material during operation, thereby compromising the performance and reliability of the IC package.

DETAILED DESCRIPTION

Figure 1:
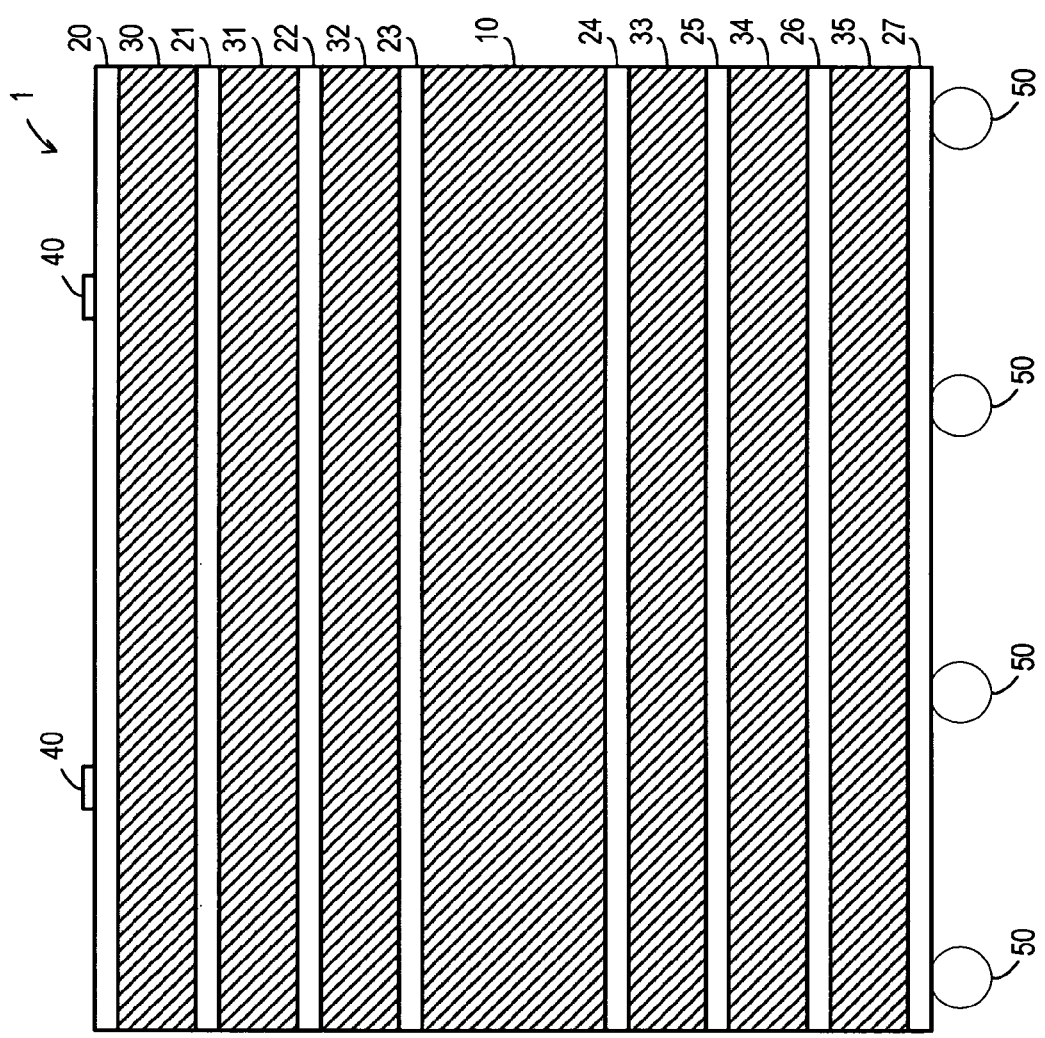
FIG. 1 is a cross-sectional side view of an apparatus according to some emmbodiments.

FIG. 1 is a cross-sectional side view of a portion of IC package 1. IC package 1 may comprise any ceramic, organic, and/or other suitable material. IC package 1 may be suitable for receiving an IC die and electrically coupling the IC die to external components/circuitry.

IC package 1 includes IC package core 10. Core 10 may be composed of any suitable material, including but not limited to bismalemide triazine (BT) and FR4 in some embodiments. Intermediate layers 30 through 35 may be composed of dielectric material and/or other material such as BT or FR4. Metallization layers 20 through 27 may include conductive traces for routing signals within IC package 1. The conductive traces may comprise copper or any other suitable conductive material. IC package 10 also includes electrical contacts 40 and electrical contacts 50 for electrically coupling metallization layers 20 through 27 to an IC die and to a motherboard, respectively. Although electrical contacts 40 and electrical contacts 50 are illustrated as built-up pads and solder balls, respectively, any suitable electrical contacts may be used depending upon the system in which IC package 1 is to be used.

A conductive trace within metallization layer 22 may include a microvia pad for electrically coupling the trace to a microvia. Such a microvia may exist within intermediate layer 32 between metallization layer 22 and metallization layer 23. A conductive trace within metallization layer 23 may include a second microvia pad that is also electrically coupled to the microvia. The microvia may thereby electrically couple the two conductive traces of the two metallization layers to one another.

Figure 2:
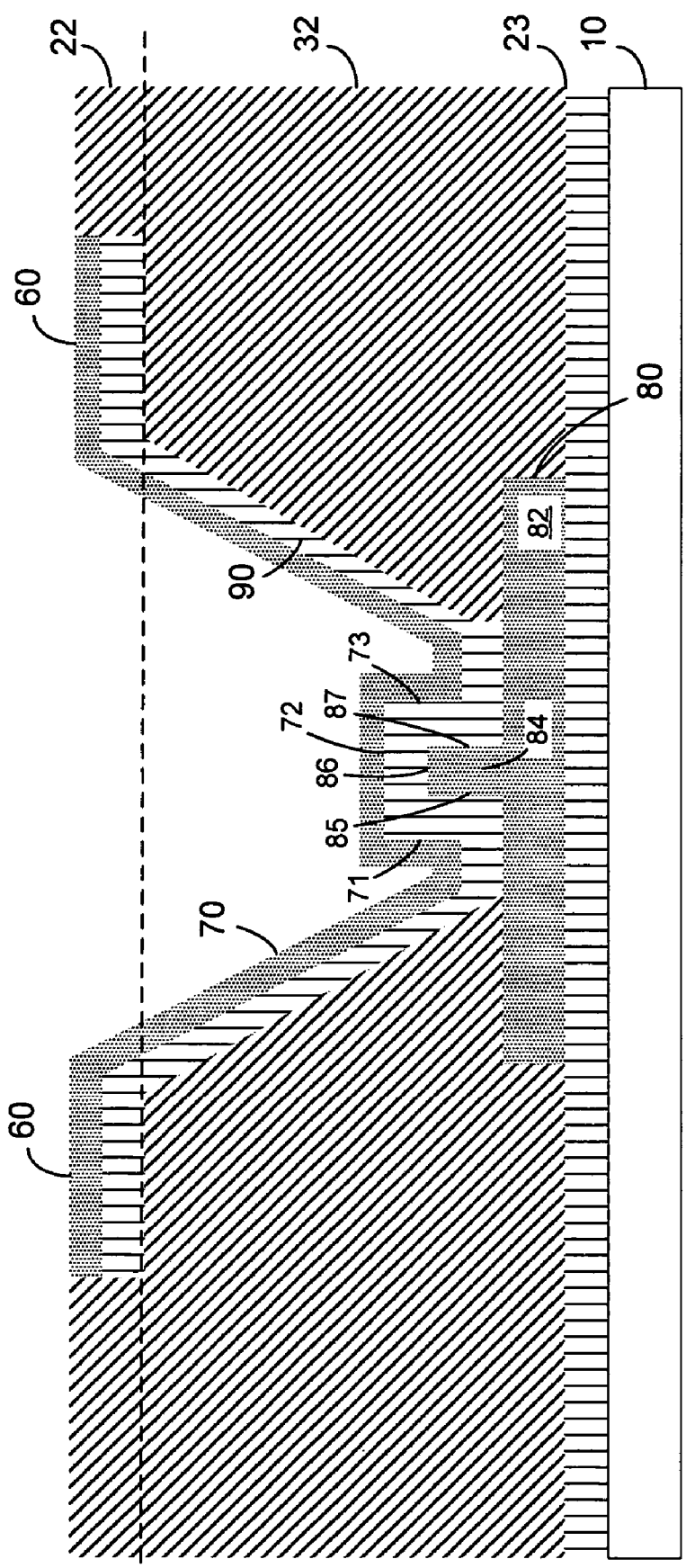
FIG. 2 is a cross-sectional side view of an apparatus according to some embodiments.

FIG. 2 is a close-up cross-sectional side view of a portion of metallization layer 22, intermediate layer 32, and metallization layer 23 according to some embodiments. Metallization layer 22 includes microvia pad 60, intermediate layer 32 includes microvia 70, and metallization layer 23 includes microvia pad 80. Microvia pad 60, microvia 70, and microvia pad 80 are each composed of conductive material. Moreover, material 90 disposed between microvia 70 and microvia pad 80 also comprises a conductor. Accordingly, microvia 70 is electrically coupled to microvia pad 60 and microvia pad 80.

Microvia pad 60, microvia 70, and microvia pad 80 may comprise electrolytic copper. Material 90 may comprise electroless copper to provide a suitable substrate for the electrolytic copper. Other conductive materials may be used for microvia pad 60, microvia 70, microvia pad 80, and material 90.

Microvia pad 80 includes base 82 and projection 84 extending therefrom toward microvia pad 60. Projection 84 may be integral to microvia pad 80. Projection 84 comprises a plurality of surfaces, including surfaces 85 through 87. Microvia 70 includes surfaces 71 through 73 facing respective ones of surfaces 85 thorough 87. Projection 84 may comprise any three-dimensional shape (e.g. cylinder cube, polyhedra, etc.) having any number of surfaces. Projection 84 may improve the mechanical reliability of the interface between microvia 70 and microvia pad 80 according to some embodiments.

FIG. 2 shows that metallization layers 22 and 23 might not be as homogenous as illustrated in FIG. 1. Specifically, metallization layers 20 through 27 may include dielectric material, substrate material, other material, as well as metallized conductors.

Figure 3:
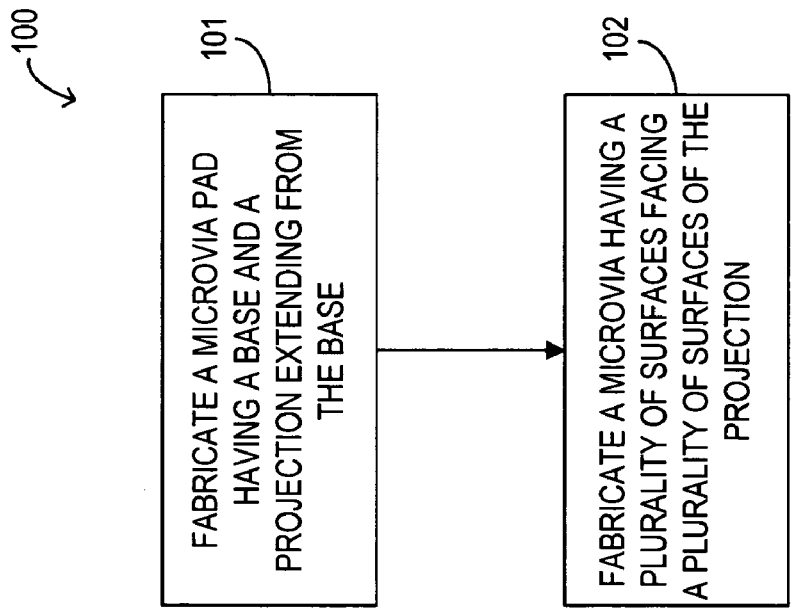
FIG. 3 is a diagram of a process to fabricate the FIG. 1 apparatus according to some embodiments.

FIG. 3 is a diagram of process 100 to fabricate microvia 70 according to some embodiments. Process 100 may be executed by one or more fabrication devices, and all or a part of process 100 may be executed manually. Process 100 may be executed by an entity different from an entity that manufactures an IC die to which IC package 1 is subsequently coupled.

Figure 4:
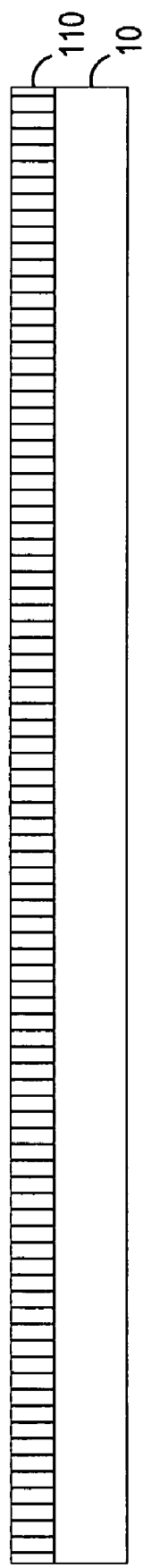
FIG. 4 is a cross-sectional side view of an IC package core illustrating a photolithographic stage according to some embodiments.

Initially, at 101, a microvia pad is fabricated. The microvia pad comprises a base and a projection extending from the base. FIG. 4 is a cross-sectional side view of IC package core 10 for illustrating a photolithographic stage to fabricate a microvia pad according to some embodiments. The microvia pad will be described as fabricated on core 10, but may also be fabricated on dielectric material of any of intermediate layers 30 through 35 of FIG. 1 in some embodiments.

Electroless conductor layer 110 may be deposited on core 10 in order to receive an electrolytic conductor thereon. Electroless conductor layer 110 may comprise copper and may be deposited on core 10 using currently- or hereafter-known techniques for electroless copper deposition. Such techniwues include but are not limited to sputtering and chemical vapor deposition. In some embodiments, electroless conductor layer 110 is not used to receive a subsequently-deposited electrolytic conductor.

Figure 5:
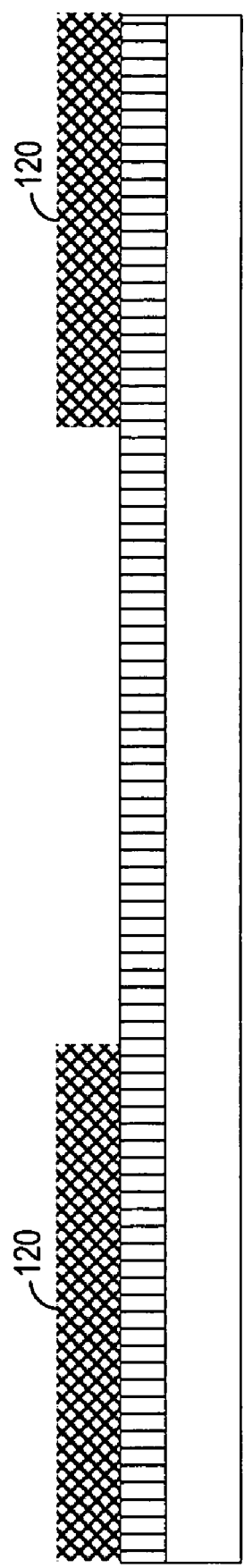
FIG. 5 is a cross-sectional side view of an IC package core illustrating a photolithographic stage according to some embodiments.

FIG. 5 illustrates a next photolithographic stage. As shown, photoresist 120 is deposited on electroless conductor layer 110, and portions thereof are selectively removed using any suitable technique such as masking, UV exposure and stripping. Photoresist 120 may comprise dry film, liquid, or other photoresist and may be deposited using any currently- or hereafter-known techniques.

Figure 6:
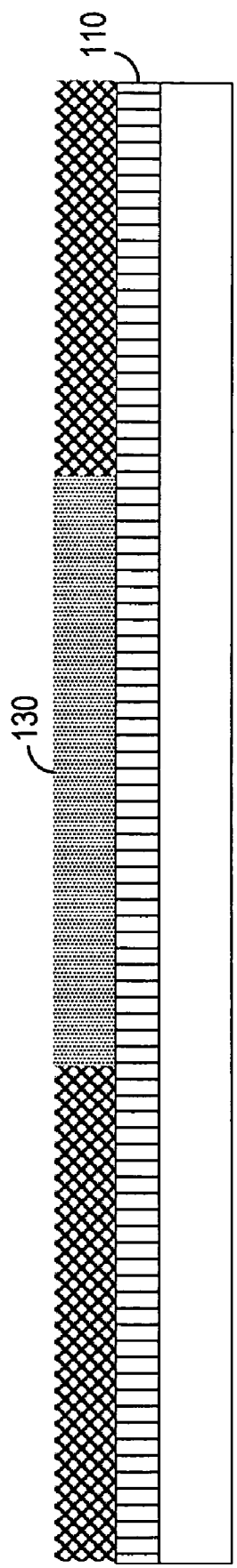
FIG. 6 is a cross-sectional side view of an IC package core illustrating a photolithographic stage according to some embodiments.

Conductive material may then be deposited on the exposed portion of layer 110 using electroplating techniques. Other deposition techniques may also be used in some embodiments. FIG. 6 illustrates conductive material 130 deposited on layer 110. Conductive material 130 may comprise electrolytic copper, and may form a base of a microvia pad. Conductive material 130 may also be deposited elsewhere on layer 110 and within metallization layer 23 to form conductive traces in addition to the base of the microvia pad.

Figure 7:
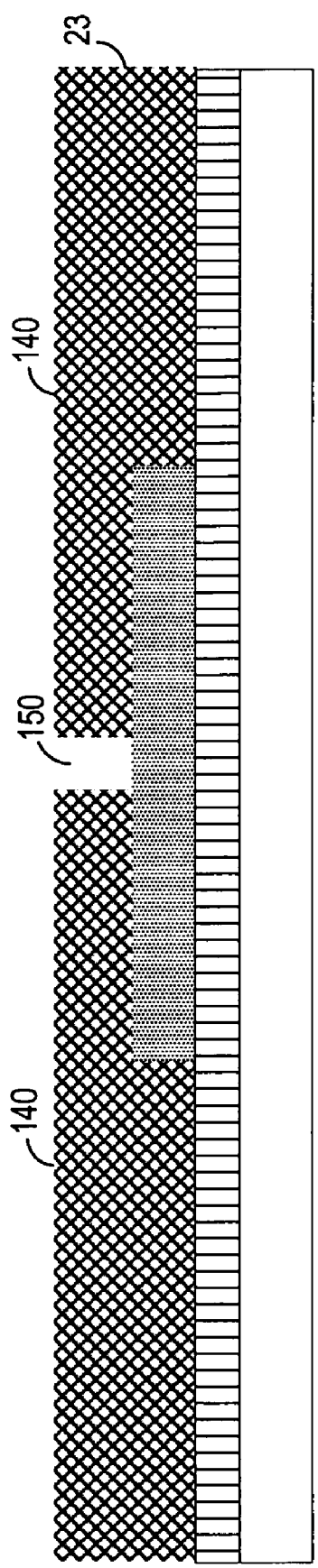
FIG. 7 is a cross-sectional side view of an IC package core illustrating a photolithographic stage according to some embodiments.
Figure 8:
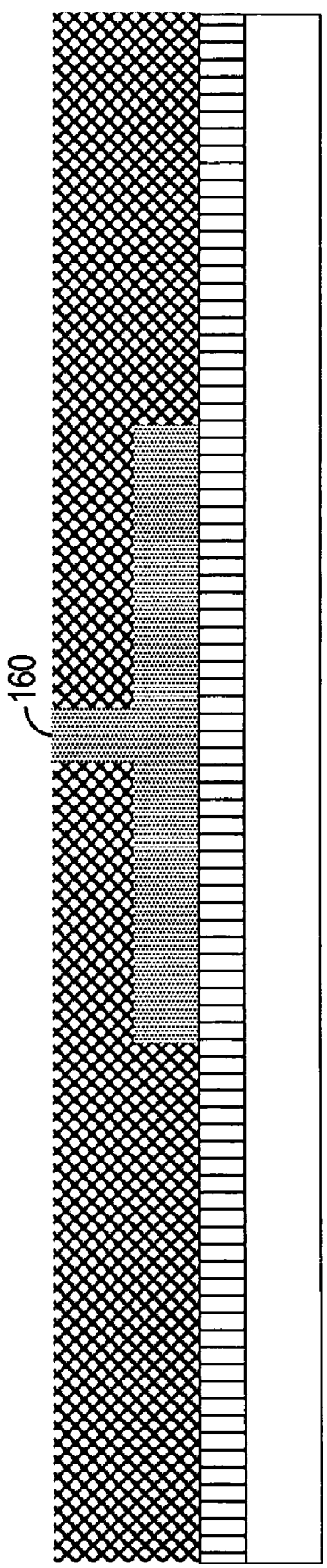
FIG. 8 is a cross-sectional side view of an IC package core illustrating a photolithographic stage according to some embodiments.
Figure 9:
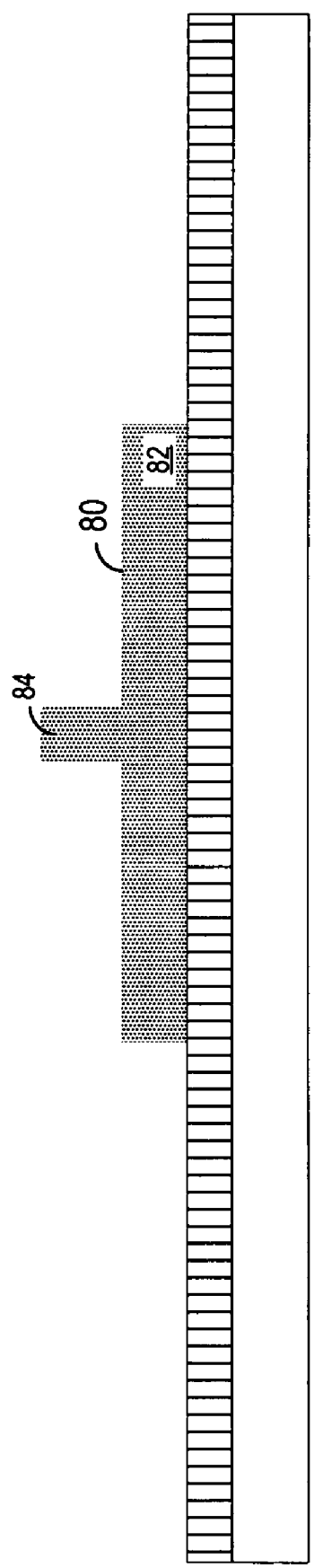
FIG. 9 is a cross-sectional side view of an IC package core illustrating a photolithographic stage according to some embodiments.

Additional photoresist is then applied as shown in FIG. 7. Photoresist 140 may be similar to or different from photoresist 130. As shown, phototresist 140 may be patterned and developed to define opening 150. Conductive material 160 may then be deposited within opening 150 as shown in FIG. 8. Conductive material 160 may comprise electrolytic copper or another conductive material. Photoresist 130 and 140 may be subsequently removed to result in the structure shown in FIG. 9. Microvia pad 80 includes base 82 and projection 84 extending therefrom. Other methods to fabricate a microvia pad having a base and a projection extending from the base may be used in some embodiments.

Figure 10:
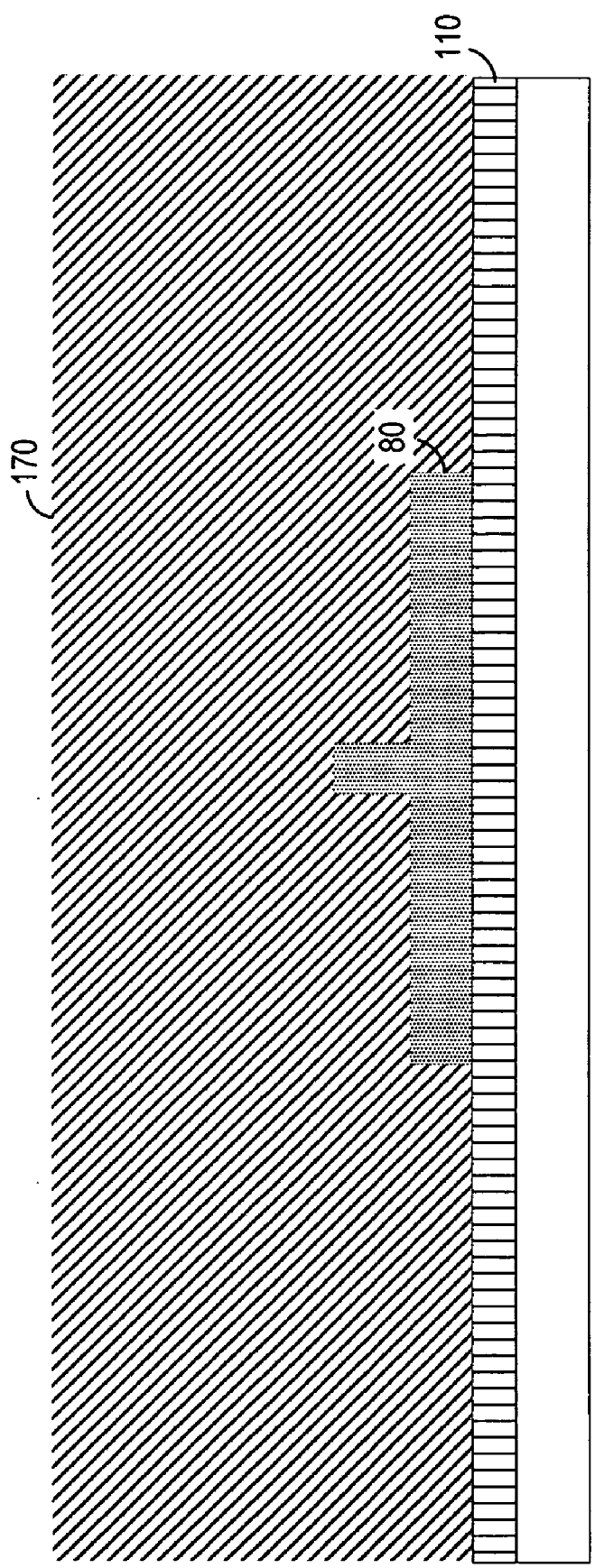
FIG. 10 is a cross-sectional side view of an IC package core illustrating a photolithographic stage according to some embodiments.

Returning to process 100, a microvia is fabricated at 102. The microvia may have a plurality of surfaces that face a plurality of surfaces of the projection fabricated at 101. According to some embodiments of 102, dielectric material 170 is deposited on microvia pad 80 and electroless conductor layer 110 as shown in FIG. 10. Dielectric material 170 may comprise any dielectric material suitable for an intermediate layer, including a polymer material. Dielectric material 170 may be laminated, spray coated, or deposited using other techniques.

Figure 11:
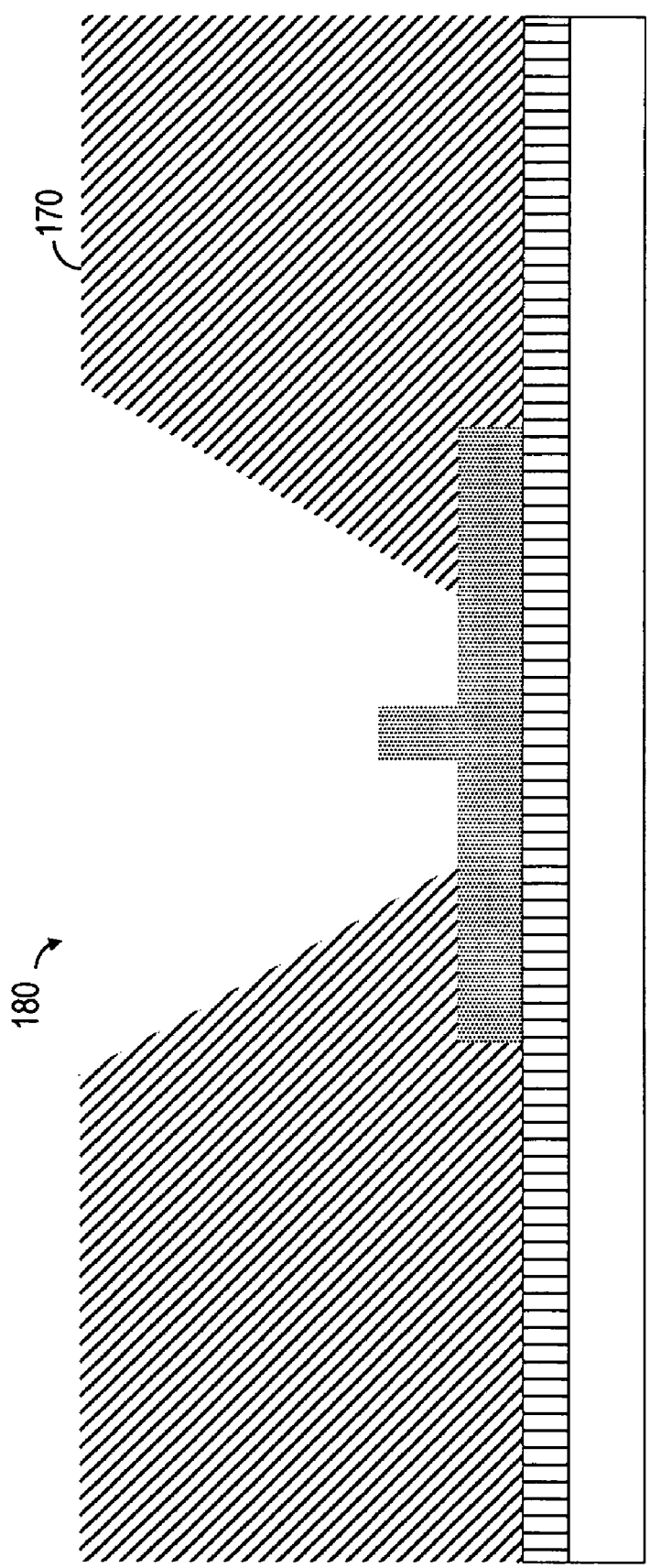
FIG. 11 is a cross-sectional side view of an IC package core illustrating a photolithographic stage according to some embodiments.
Figure 12:
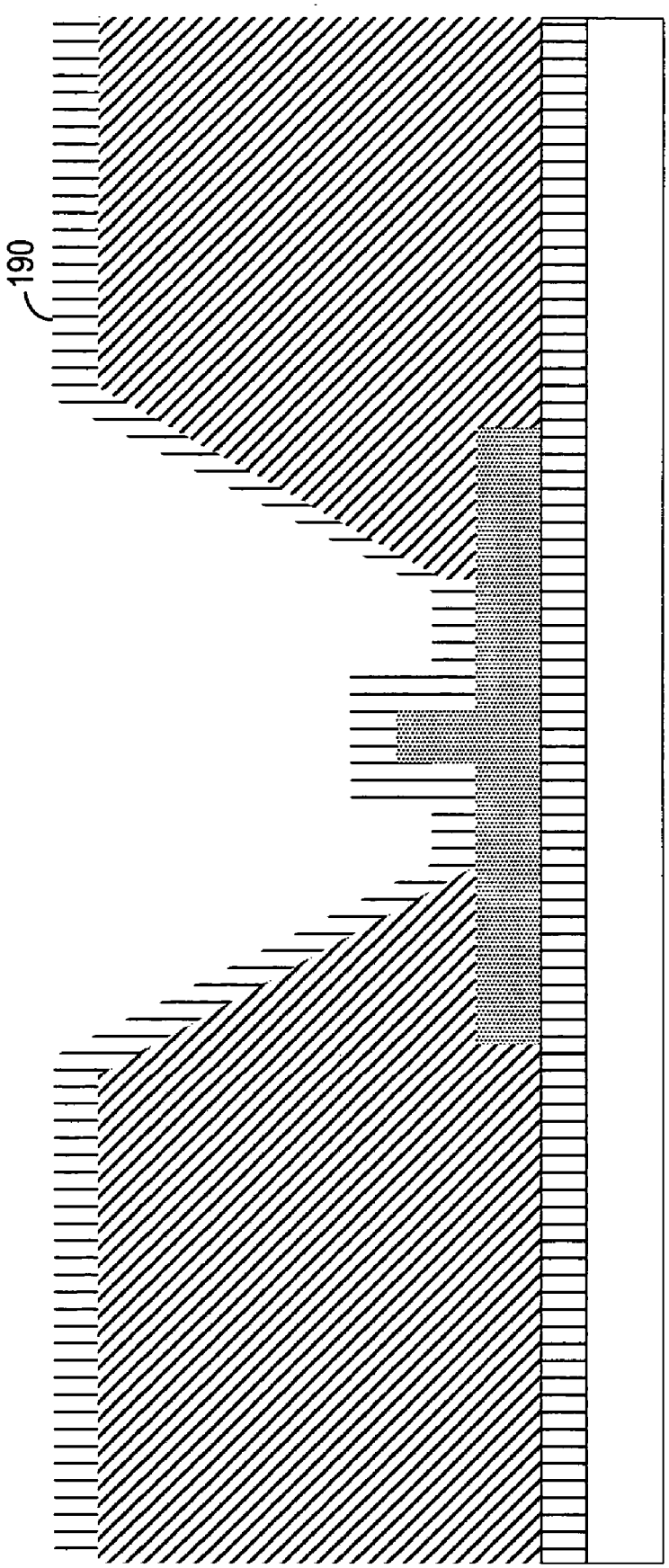
FIG. 12 is a cross-sectional side view of an IC package core illustrating a photolithographic stage according to some embodiments.
Figure 13:
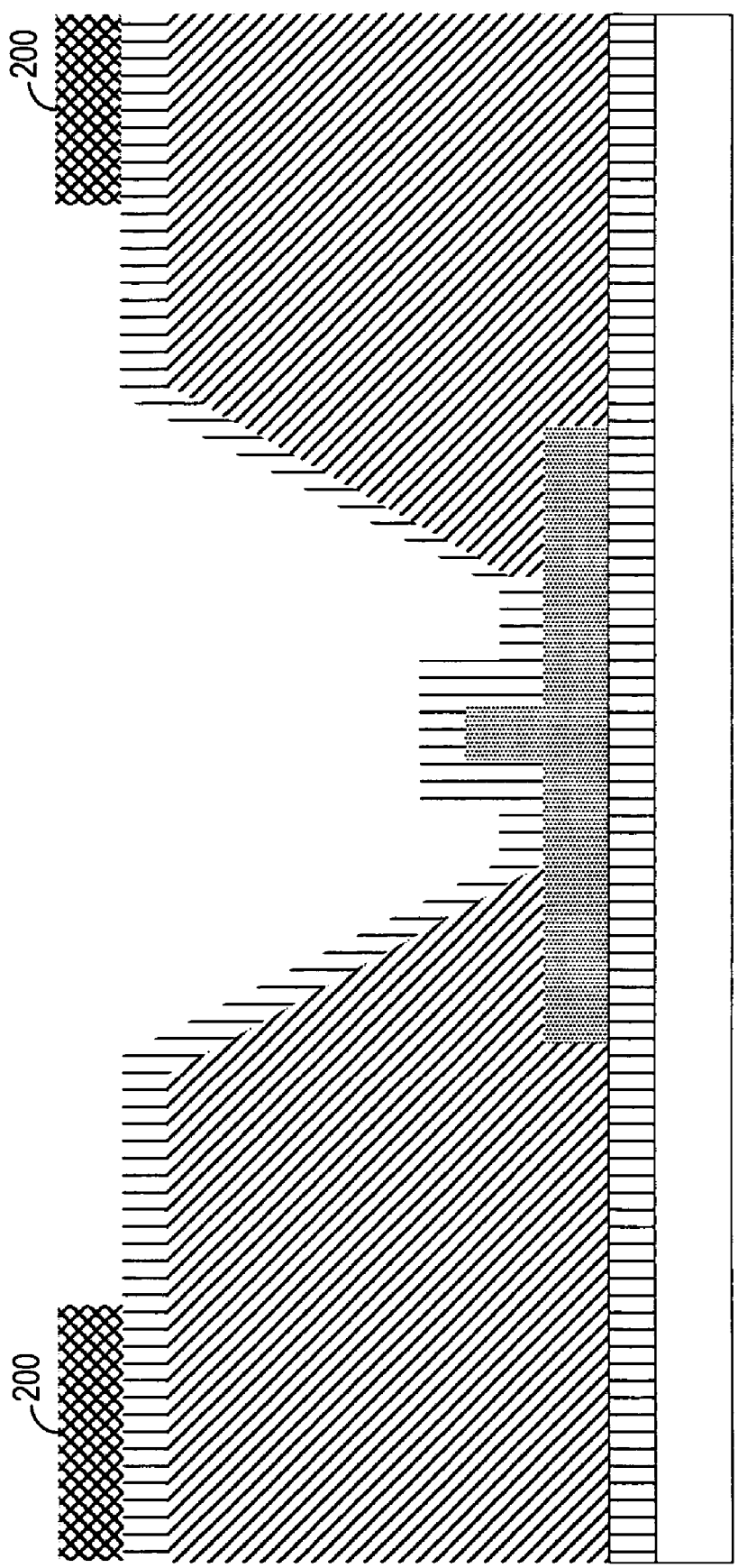
FIG. 13 is a cross-sectional side view of an IC package core illustrating a photolithographic stage according to some embodiments.

FIG. 11 shows opening 180 formed in dielectric 170 according to some embodiments. Opening 180 may be formed by laser drilling, photolithography, and/or other techniques. Second electroless conductor layer 190 may then be deposited in opening 180 and on surrounding structures as shown in FIG. 12. Second electroless conductor layer 190 may be deposited to provide for subsequent deposition of an electrolytic conductor thereon. Accordingly, FIG. 13 illustrates photoresist 200 that has been deposited, patterned, developed, and removed to create an area on which to deposit a conductor.

Figure 14:
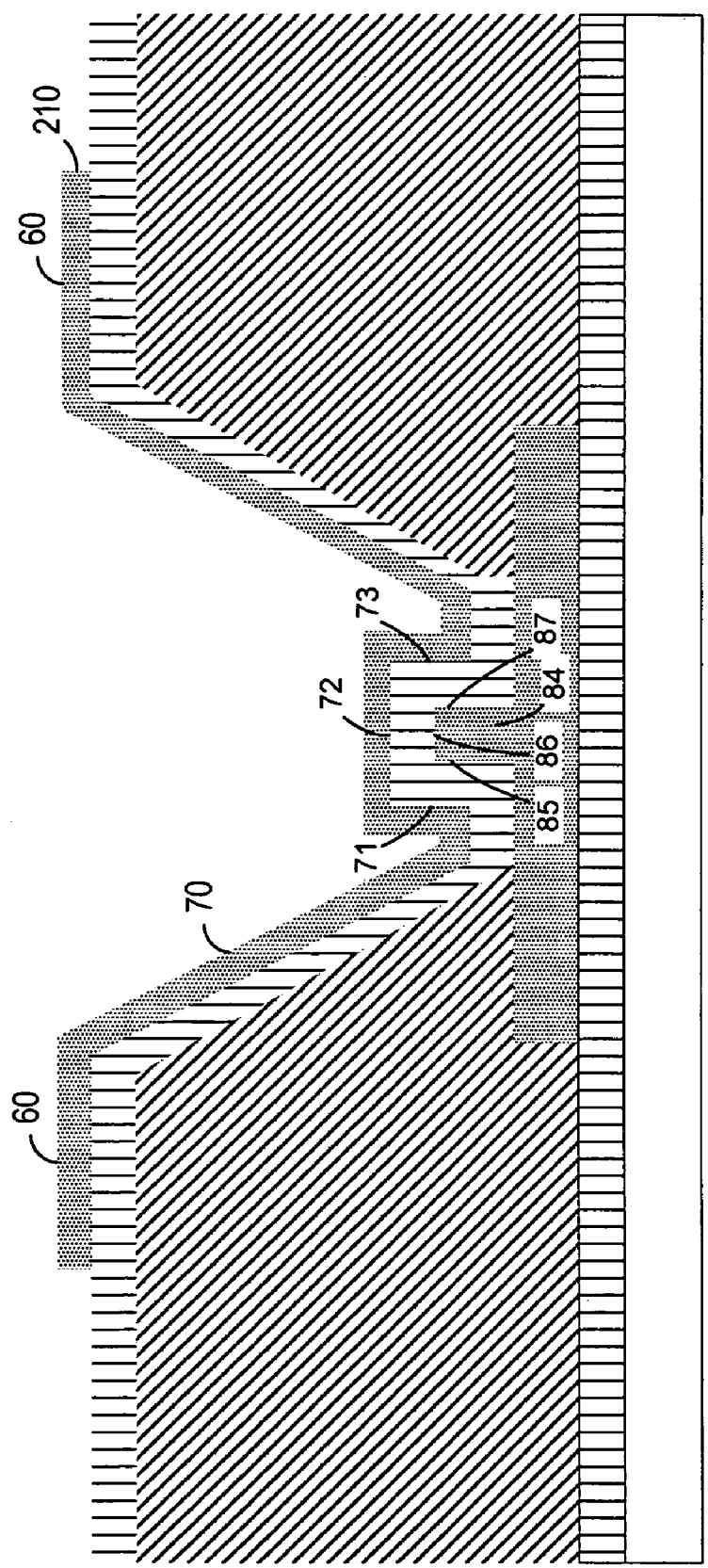
FIG. 14 is a cross-sectional side view of an apparatus according to some embodiments.

FIG. 14 illustrates 102 after deposition of conductor 210 and removal of photoresist 200. Conductor 210 may comprise an electrolytic conductor such as electrolytic copper. As described with respect to FIG. 2, conductor 210 comprises microvia pad 60 and microvia 70. Microvia 70 includes at least surfaces 71, 72 and 73 which face surfaces 85, 86 and 87 of projection 84. After deposition of conductor 210, portions of second conductor layer 190 that are uncovered by conductor 210 may be etched off and replaced by dielectric material as shown in FIG. 2.

Figure 15:
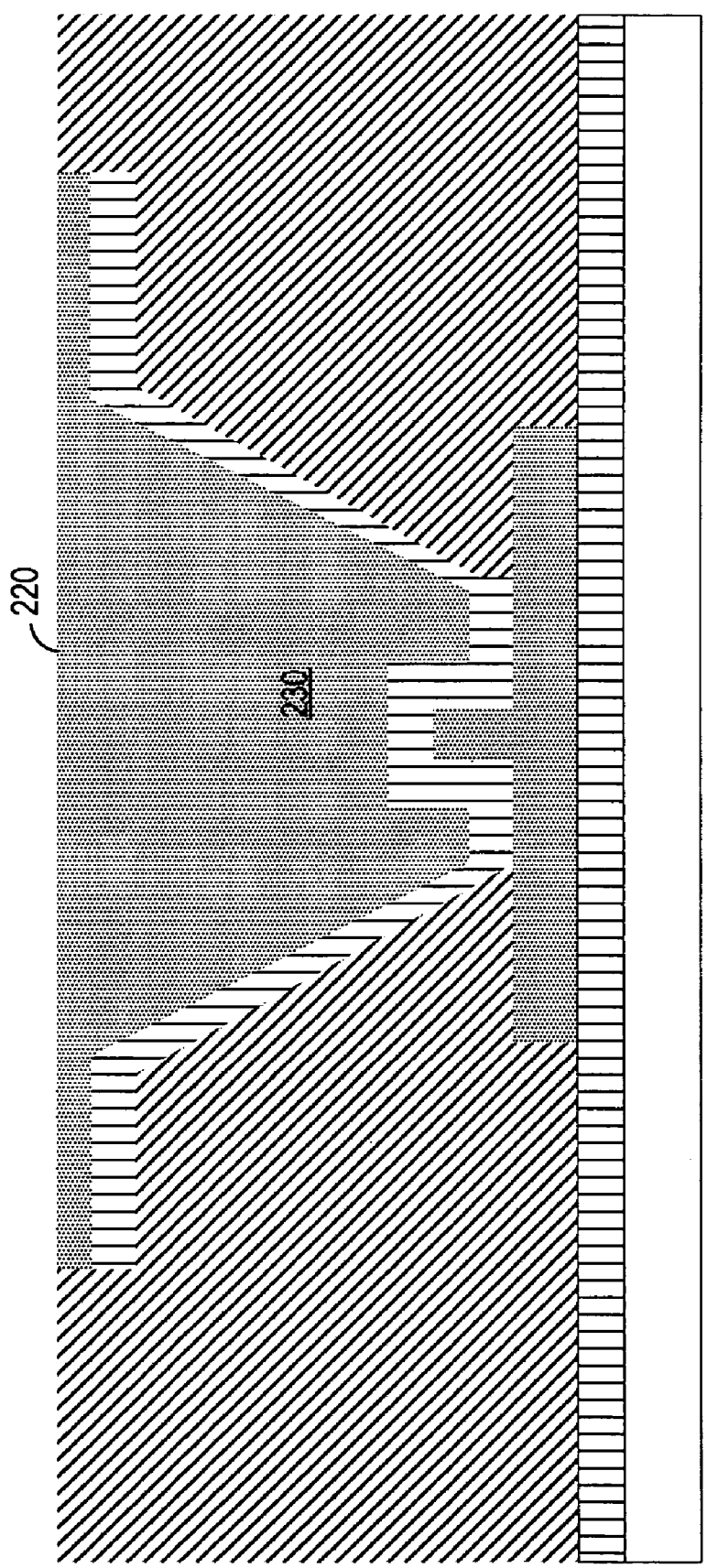
FIG. 15 is a cross-sectional side view of an apparatus according to some embodiments.

FIG. 15 shows microvia pad 220 and microvia 230 according to some embodiments. Both microvia pad 220 and microvia 230 include more conductive material than pad 60 and microvia 70 of FIG. 2. Currently- or hereafter-known techniques for filling a volume with conductive material may be used to create the structure of FIG. 15. The structure of FIG. 15 may provide easier planarization than the structure of FIG. 2.

Figure 16:
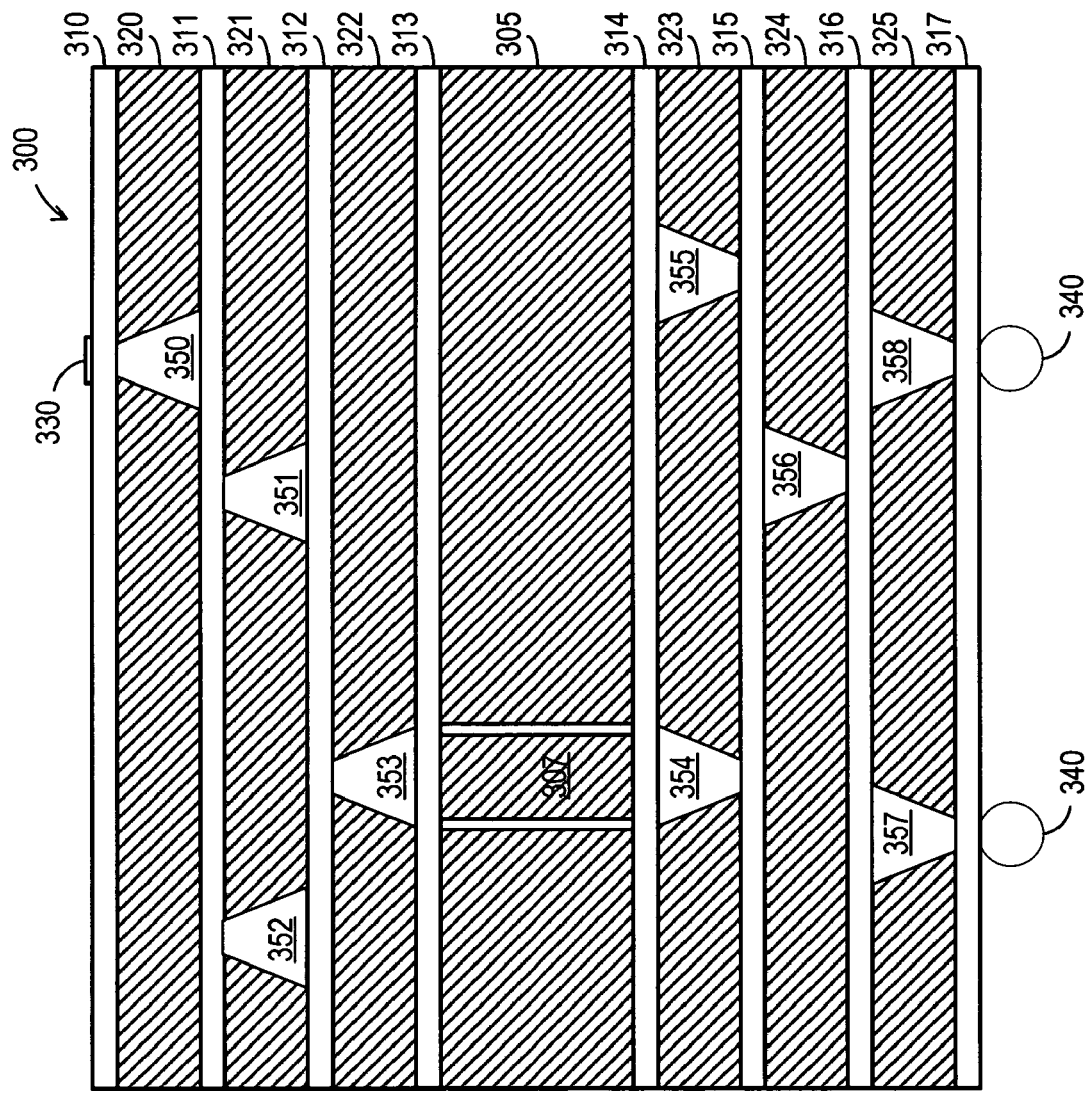
FIG. 16 is a cross-sectional side view of an apparatus according to some embodiments.

FIG. 16 is a cross-sectional side view of a portion of IC package 300 according to some embodiments. IC package 300 includes IC package core 305, which may comprise any ceramic, organic, and/or other suitable material including bismalemide triazine (BT) and FR4. IC package 300 may be suitable for receiving an IC die and electrically coupling the IC die to external components/circuitry.

Metallization layers 310 through 317 may include conductive traces for routing signals within IC package 300. The conductive traces may comprise copper or any other suitable conductive material. IC package core 305 includes plated through hole 307 to electrically couple metallization layer 313 to metallization layer 314. Intermediate layers 320 through 325 may be composed of dielectric material and/or other material such as BT or FR4.

Intermediate layers 320 through 325 each include at least one of microvias 350 through 358. Microvia 351 includes a first portion and a second portion, with the first portion having a greater width than the second portion. A distance between the first portion and package core 305 is less than a distance between the second portion and package core 305. In some embodiments, such an arrangement may reduce a possibility that microvia 351 may delaminate from a microvia pad located in metallization layer 311 and/or a microvia pad located in metallization layer 312.

Microvia 353 is adjacent to a first side of IC package core 305, and microvia 355 is adjacent to a second side of IC package core 305. Microvia 355 includes a third portion and a fourth portion, with the third portion having a greater width than the fourth portion. A distance between the third portion and package core 305 is less than a distance between the fourth portion and package core 305. According to some embodiments, one or more intermediate layers might not include a microvia, and/or a distance between a first portion of one or more microvias of IC package 300 and package core 305 may be greater than a distance between a second portion of the one or more microvias and package core 305.

IC package 300 includes electrical contacts 330 and electrical contacts 340 for electrically coupling metallization layers 310 through 317 to an IC die and to a motherboard, respectively. Although electrical contacts 330 and electrical contacts 340 are built-up pads and solder balls, respectively, any suitable electrical contacts may be used depending upon the system in which IC package 300 is to be used.

Figure 17:
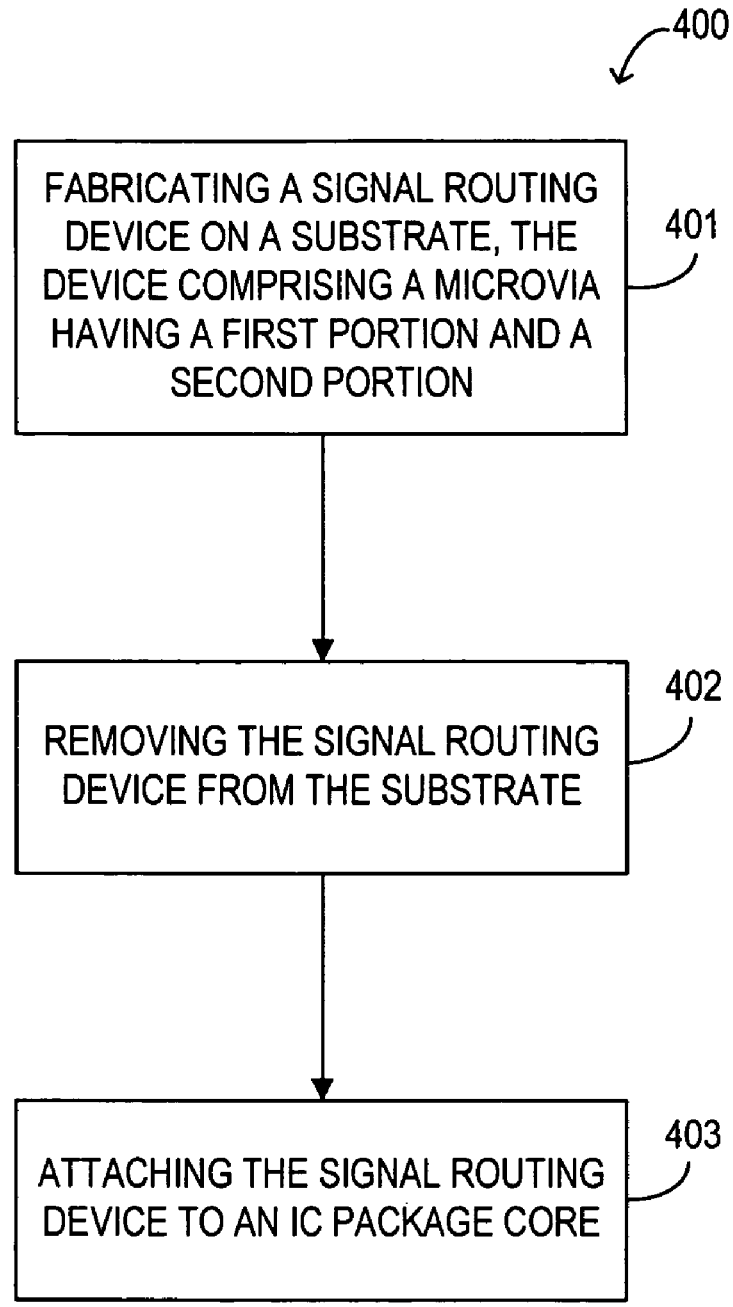
FIG. 17 is a diagram of a process to fabricate the FIG. 15 apparatus according to some embodiments.

FIG. 17 is a diagram of process 400 to fabricate IC package 300 according to some embodiments. Process 400 may be executed by one or more fabrication devices, and all or a part of process 400 may be executed manually. Process 400 may be executed by an entity different from an entity that manufactures an IC die to which IC package 300 is subsequently coupled.

Figure 18:
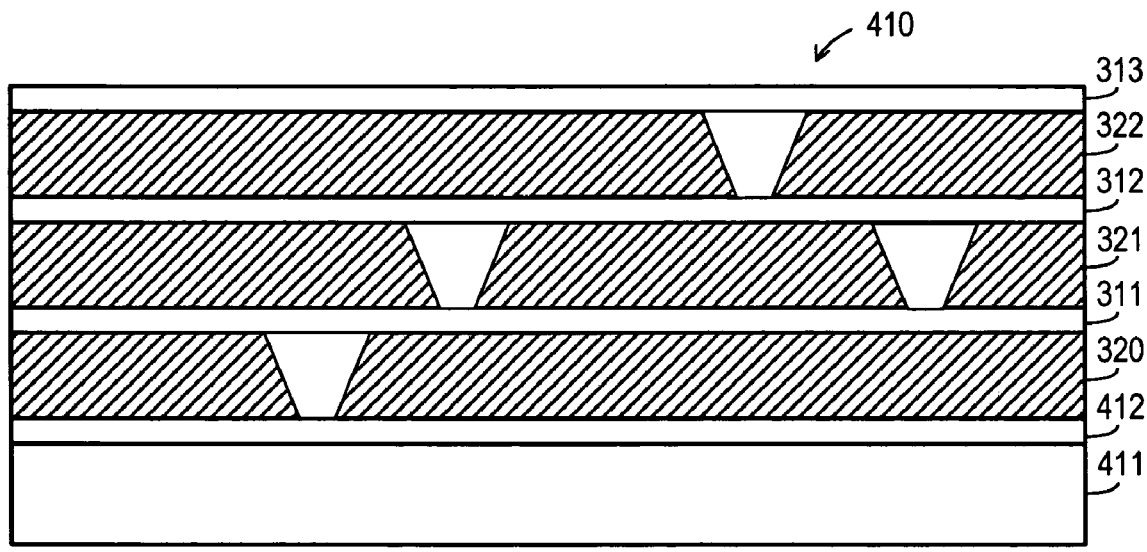
FIG. 18 is a cross-sectional side view of routing devices attached to respective IC package cores according to some embodiments.
Figure 18:
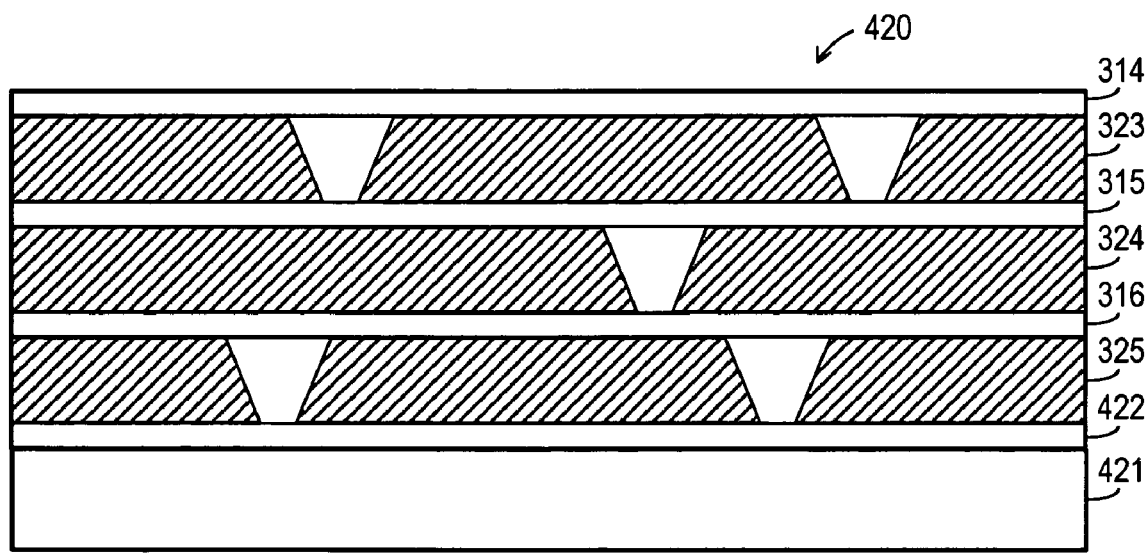

A signal routing device is fabricated on a substrate at 401. The signal routing device includes at least one microvia having a first portion and a second portion. FIG. 18 illustrates signal routing devices 410 and 420 as fabricated on respective substrates 411 and 421 according to some embodiments of 401. Routing device 410 includes metallization layers 311 through 313 and intermediate layers 320 through 322 as shown in FIG. 16, and routing device 420 includes metallization layers 314 through 316 and intermediate layers 323 through 325. In some embodiments, two signal routing devices are fabricated on opposite sides of a single substrate at 401. Although two signal routing devices are illustrated in FIG. 8, some embodiments of process 400 are executed in conjunction with a single signal routing device.

Substrates 411 and 421 may comprise any suitable base on which electrical elements may be fabricated. Examples include a work surface such as a glass or metal wafer chuck, BT or FR4 substrate material, or other substrate materials. Substrates 411 and 421 may be coated with respective release layers 412 and 422 prior to fabricating signal routing devices 410 and 420 thereon. Release layers 412 and 422 may comprise a release film or any other currently- or hereafter-known release layer composition.

Signal routing devices 410 and 420 are then fabricated on release layers 412 and 422 according to currently- or hereafter-known systems for fabricating routing devices that include layers of traces, interlayer dielectric material, and vias between the layers of conductive traces. According to some embodiments, process 100 is used to fabricate routing devices 410 and 420.

Figure 19:
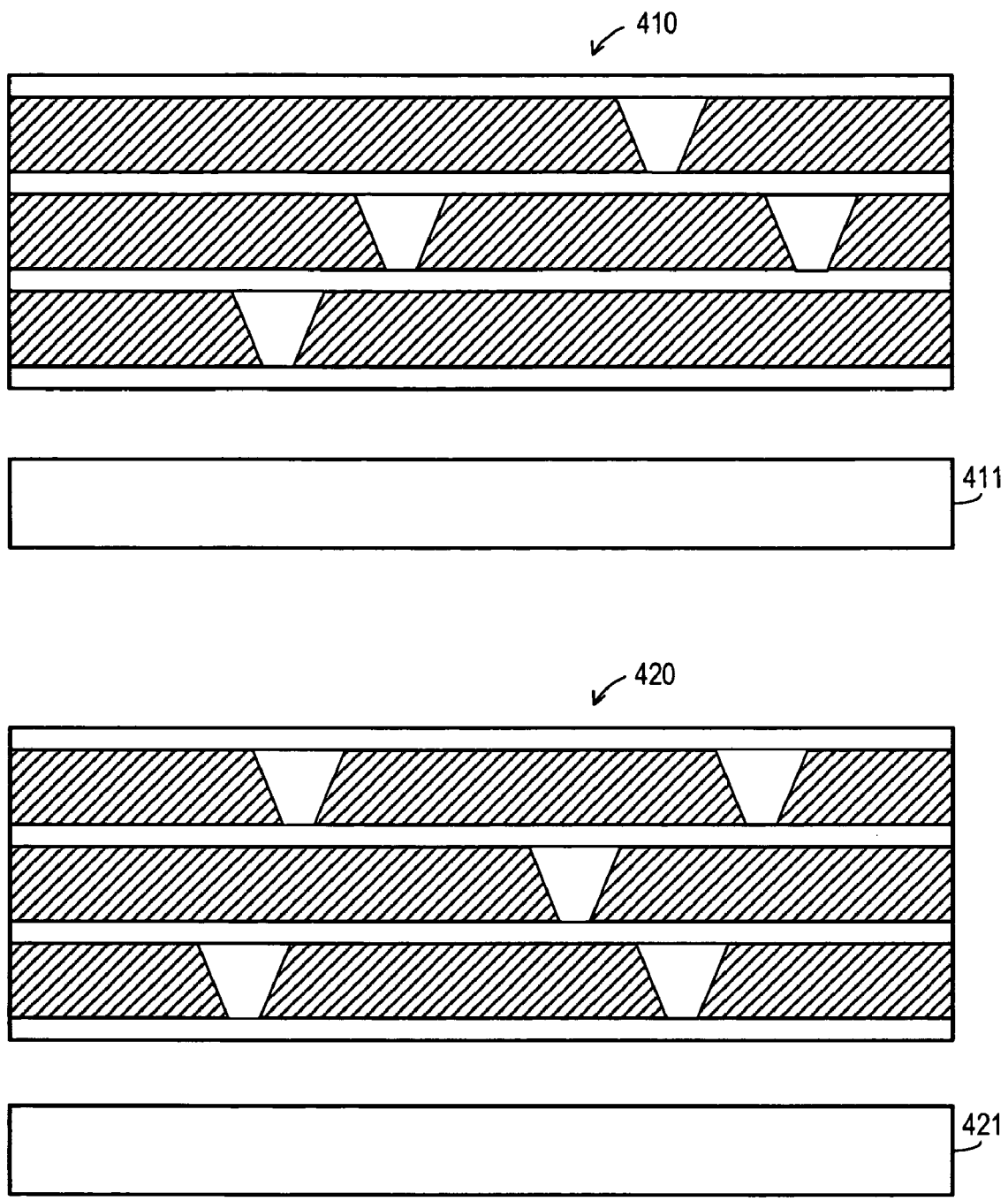
FIG. 19 is a cross-sectional side view of routing devices and an IC package core according to some embodiments.

Signal routing devices 410 and 420 are then removed from substrates 411 and 421 at 402. Removal may include peeling signal routing devices 410 and 420 and respective release layers 412 and 422 from substrates 411 and 421. In some embodiments, release layers 412 and 422 are dissolved at 402, thereby removing signal routing devices 410 and 420 from substrates 411 and 421. FIG. 19 shows signal routing devices 410 and 420 after being removed from substrates 411 and 421 according to some embodiments.

Figure 20:
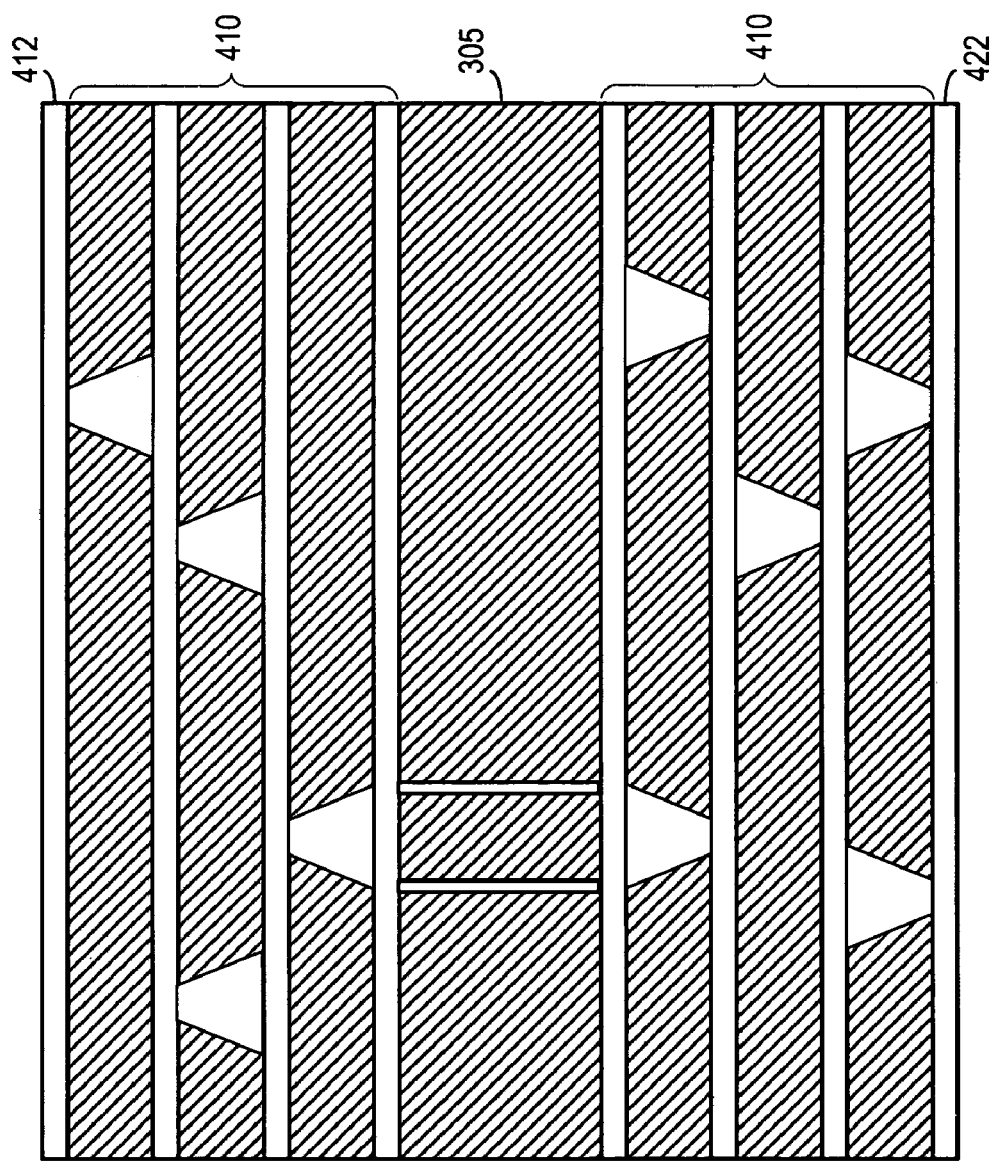
FIG. 20 is a cross-sectional side view of routing devices attached to an IC package core according to some embodiments.

Next, at 403, signal routing devices 410 and 420 are attached to an IC package core. FIG. 20 illustrates signal routing devices 410 and 420 as attached to IC package core 305 according to some embodiments. Signal routing devices 410 and 420 may be laminated to IC package core 305 at 403. Signal routing device 410 is attached to IC package core 305 such that a distance between a first portion of at least one microvia of device 410 and package core 305 is less than a distance between a second portion of the at least one microvia and package core 305, the first portion being wider than the second portion. Similarly, signal routing device 420 is attached to IC package core 305 such that a distance between a first portion of at least one microvia of device 420 and package core 305 is less than a distance between a second portion of the at least one microvia and package core 305, with the first portion again being wider than the second portion.

According to some embodiments, release layers 412 and 422 are stripped from routing devices 410 and 420 after 403. Then, metallization layers 310 and 317 are added to package 300 along with electrical contacts 330 and 340 as illustrated in FIG. 16.

Figure 21:
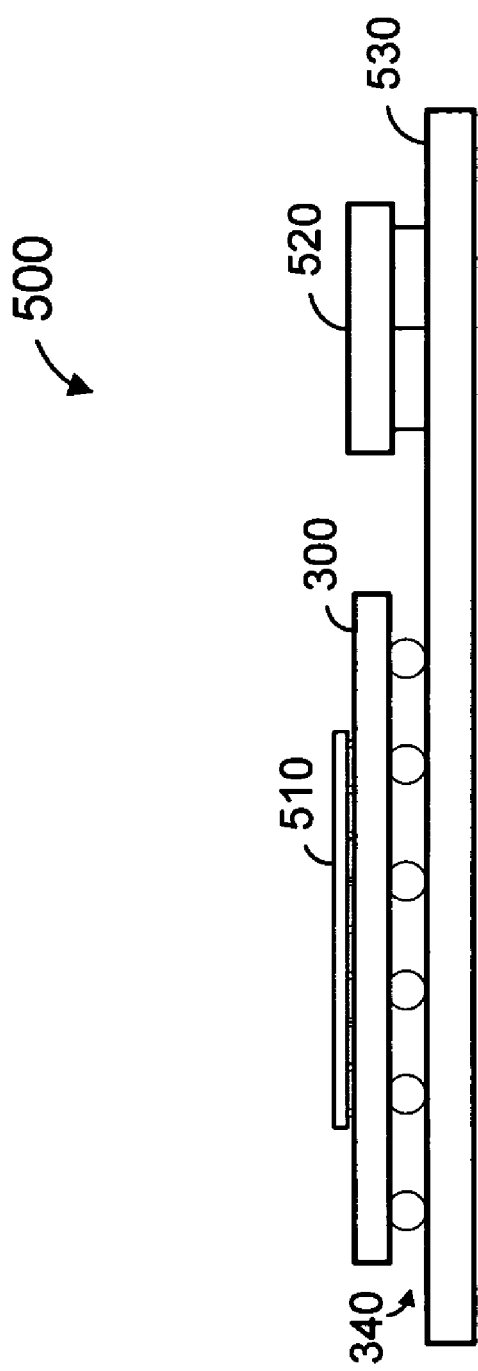
FIG. 21 is a diagram of a system according to some embodiments.

FIG. 21 is a side elevation of system 500 according to some embodiments. System 500 may comprise components of a server platform. System 500 includes IC package 300 as described above, IC die 510, memory 520 and motherboard 530. IC die 510 may comprise a microprocessor.

Motherboard 530 may electrically couple memory 520 to IC package 300. More particularly, motherboard 530 may comprise a memory bus (not shown) that is electrically coupled to electrical contacts 340 and to memory 520. Memory 520 may comprise any type of memory for storing data, such as a Single Data Rate Random Access Memory, a Double Data Rate Random Access Memory, or a Programmable Read Only Memory.

The several embodiments described herein are solely for the purpose of illustration. The various features described herein need not all be used together, and any one or more of those features may be incorporated in a single embodiment. Some embodiments may include any currently or hereafter-known versions of the elements described herein. Therefore, persons skilled in the art will recognize from this description that other embodiments may be practiced with various modifications and alterations.

What is claimed is:

1. An apparatus comprising:
   an integrated circuit package comprising:
   a first metallization layer comprising a first microvia pad;
   a second metallization layer comprising a second microvia pad having a projection extending in a direction toward the first microvia pad; and
   an intermediate layer disposed between the first metallization layer and the second metallization layer, the intermediate layer comprising a microvia electrically coupled to the first microvia pad and to the second microvia pad.

2. The apparatus according to claim 1, wherein the microvia includes a plurality of surfaces facing a plurality of surfaces of the projection.

3. The apparatus according to claim 1, wherein the projection is an integral portion of the second microvia pad.

4. The apparatus according to claim 1, further comprising:
   an electroless conductor disposed between the microvia and the second microvia pad,
   wherein the second microvia pad and the microvia are composed of an electrolytic conductor.

5. An apparatus comprising:
   an integrated circuit package comprising:
   a first metallization layer comprising a first microvia pad;
   a second metallization layer comprising a second microvia pad; and
   an intermediate layer disposed between the first metallization layer and the second metallization layer, the intermediate layer comprising a microvia electrically coupled to the first microvia pad and to the second microvia pad, wherein the microvia includes a plurality of surfaces facing respective ones of a plurality of surfaces of the second microvia pad.

6. The apparatus according to claim 5, further comprising:
an electroless conductor disposed between the microvia and the second microvia pad,
wherein the second microvia pad and the microvia are composed of an electrolytic conductor.

7. A method comprising:
fabricating a microvia pad having a base and a projection extending from the base; and
fabricating a microvia having a plurality of surfaces facing a plurality of surfaces of the projection.

8. A method according to claim 7, further comprising:
fabricating an electroless conductor disposed between the microvia and the microvia pad,
wherein the microvia pad and the microvia are composed of an electrolytic conductor.

9. A method according to claim 8, wherein fabricating the microvia pad comprises:
fabricating the base; and
fabricating the projection extending from the base after fabricating the base.

10. A system comprising:
an integrated circuit package comprising:
a first microvia pad;
a second microvia pad having a projection extending in a direction toward the first microvia pad; and
a microvia electrically coupled to the first microvia pad and to the second microvia pad; and
a double data rate memory electrically coupled to the integrated circuit package.

11. A system according to claim 10, wherein the microvia includes a plurality of surfaces facing a plurality of surfaces of the projection.

12. A system according to claim 10, wherein the projection is an integral portion of the second microvia pad.

13. A system according to claim 10, further comprising:
a motherboard electrically coupled to the integrated circuit package and to the memory.

* * * * *

UNITED STATES PATENT AND TRADEMARK OFFICE
CERTIFICATE OF CORRECTION

| | |
|---|---|
| PATENT NO. | : 7,049,526 B2 |
| APPLICATION NO. | : 10/700209 |
| DATED | : May 23, 2006 |
| INVENTOR(S) | : Jones et al. |

It is certified that error appears in the above-identified patent and that said Letters Patent is hereby corrected as shown below:

Col. 7, line 18, should read:

9. A method comprising:

fabricating <u>a first metallization layer comprising a first</u> microvia pad; <u>and</u> fabricating <u>a second metallization layer comprising a second microvia pad wherein the</u> [a] microvia pad having a base and a projection extending from the base; and <u>fabricating an intermediate layer disposed between the first metallization layer and the second metallization layer, the intermediate layer comprising a microvia electrically coupled to the first microvia pad and to the second microvia pad wherein the</u> [a] microvia having plurality of surfaces facing a plurality of surfaces of the projection.

Col. 8, line 3, should read:

10. [A] <u>The</u> method according to Claim 9, further comprising:

fabricating an electroless conductor disposed between the microvia and the microvia pad, wherein the microvia pad and the microvia are composed of an electrolytic conductor.

UNITED STATES PATENT AND TRADEMARK OFFICE
CERTIFICATE OF CORRECTION

| | | |
|---|---|---|
| PATENT NO. | : 7,049,526 B2 | |
| APPLICATION NO. | : 10/700209 | |
| DATED | : May 23, 2006 | |
| INVENTOR(S) | : Jones et al. | |

It is certified that error appears in the above-identified patent and that said Letters Patent is hereby corrected as shown below:

Col. 8, line 12, should read:

11. [A] The method according to Claim 10, wherein fabricating the microvia pad comprises:

fabricating the base; and fabricating the projection extending from the base after fabricating the base.

Col. 8, line 15, should read:

12. A system comprising:

an integrated circuit package comprising:

a first metallization layer comprising a first microvia pad;

a second metallization layer comprising a second microvia pad having a projection extending in a direction toward the first microvia pad; and an intermediate layer disposed between the first metallization layer and the second metallization layer, the intermediate layer comprising a microvia electrically coupled to the first microvia pad and to the second microvia pad; and a double data rate memory electrically coupled to the integrated circuit package.

Col. 8, line 17, should read:

13. [A] The system according to Claim 12, wherein the microvia includes a plurality of surfaces facing a plurality of surfaces of the projection.

UNITED STATES PATENT AND TRADEMARK OFFICE
CERTIFICATE OF CORRECTION

PATENT NO. : 7,049,526 B2
APPLICATION NO. : 10/700209
DATED : May 23, 2006
INVENTOR(S) : Jones et al.

It is certified that error appears in the above-identified patent and that said Letters Patent is hereby corrected as shown below:

Col. 8, line 20, Add Claims 14 and 15

14. [A] <u>The</u> system according to Claim 12, wherein the projection is an integral portion of the second microvia pad.

15. [A] <u>The</u> system according to Claim 12, further comprising:

a motherboard electrically coupled to the integrated circuit package and to the memory.

Signed and Sealed this

Twelfth Day of June, 2007

JON W. DUDAS
*Director of the United States Patent and Trademark Office*